(12) United States Patent
Mullane et al.

(10) Patent No.: US 8,386,209 B2
(45) Date of Patent: Feb. 26, 2013

(54) TESTING SYSTEM

(75) Inventors: Brendan Mullane, County Limerick (IL); Thomas Fleischmann, Laufen (DE); Vincent O'Brien, County Galway (IL)

(73) Assignee: University of Limerick, Limerick (IE)

( * ) Notice: Subject to any disclaimer, the term of this patent is extended or adjusted under 35 U.S.C. 154(b) by 252 days.

(21) Appl. No.: 12/737,182

(22) PCT Filed: Jun. 12, 2009

(86) PCT No.: PCT/IE2009/000035
§ 371 (c)(1),
(2), (4) Date: Dec. 16, 2010

(87) PCT Pub. No.: WO2009/153766
PCT Pub. Date: Dec. 23, 2009

(65) Prior Publication Data
US 2011/0098964 A1    Apr. 28, 2011

Related U.S. Application Data

(60) Provisional application No. 61/129,362, filed on Jun. 20, 2008.

(51) Int. Cl.
*G06F 19/00* (2011.01)
(52) U.S. Cl. ..................................................... 702/123
(58) Field of Classification Search .................... 702/123
See application file for complete search history.

(56) References Cited

U.S. PATENT DOCUMENTS 6,326,909 B1    12/2001  Yamaguchi
2008/0202244 A1 *  8/2008  Cuffe et al. ...................... 73/632

OTHER PUBLICATIONS

W. Yong-sheng et al., "A Low-cost BIST Scheme for ADC Testing," Asicon 2006, 6th International Conference on Shanghai, China, Oct. 24-27, 2005, IEEE, pp. 665-668.
M. da Gloria Flores et al., "Low Cost BIST for Static and Dynamic Testing of ADCs," Journal of Electronic Testing: Theory and Applications, Jun. 1, 2005, vol. 21, pp. 283-290.
F. Azais et al., "A Low-Cast BIST Architecture for Linear Histogram Testing of ADCs," Journal of Electronic Testing: Theory and Applications, Apr. 1, 2001, vol. 17, pp. 139-147.
E. S. Erdogan et al., "An ADC-BIST Scheme Using Sequential Code Analysis," Proceedings of the Conference on Design, Automation and Test, Nice, France: ACM Press, 2007, pp. 1-6.
M. F. Toner et al., "A BIST Scheme for an SNR Test of a Sigma-Delta ADC," International Test Conference, 1993, pp. 805-814.

* cited by examiner

*Primary Examiner* — Tung S Lau
(74) *Attorney, Agent, or Firm* — Jacobson Holman PLLC (57) ABSTRACT

A test system (1) comprises a system-on-chip with a memory (7) for storing sample data; and a dynamic test engine (4) to control input of dynamic test waveforms including sinusoidal waveforms to an ADC under test (15) and to determine device under test dynamic parameters by analysing the samples. A linear test engine (5) determines device under test (15) static parameters, and controls input of ramp input waveforms to the ADC. A test controller (2) performs finite sate machine control of testing including applying test waveforms, dumping samples to the memory (7), and retrieving static and dynamic results. A DAC (3) generates controlled waveform generation under instructions from the test engines, and an interface (10) communicates with an external host. The components are linked with a bus (11) and are modular. The test system (1) is adapted to re-use the memory (7) for both test sample acquisition, and operation of the device under test (15) is adapted to enable re-use circuits in order to minimize logic overheads and maximize use other than ADC test and measurement. The linear and dynamic test engines (5, 4) perform parallel linear and dynamic testing in which dynamic testing sample acquisition and processing takes place during application of a ramped input for linear testing.

21 Claims, 6 Drawing Sheets

Fig. 1

Fig. 2: ADC Test Control Sequence and Test Waveform

Fig. 3: Programmable DAC Architecture

Fig. 4: FFT Dynamic Test Engine

Fig. 5: Dynamic Test Engine - Arithmetic Unit

Fig. 6: Linear Test Engine

Fig. 7: Linear Test Engine – Code Detection Unit

Fig. 8(b) Actual ADC transfer function

Fig. 8(a) Ideal ADC transfer function

TESTING SYSTEM

This is a national stage of PCT/IE09/000,035 filed Jun. 12, 2009 and published in English, claiming benefit of U.S. provisional application No. 61/129,362, filed Jun. 20, 2008, hereby incorporated by reference.

FIELD OF THE INVENTION

The invention relates primarily to testing of circuits such as analog-to-digital converters (ADCs), but the invention can also apply to testing of digital to analog converters (DACs), or other mixed signal circuits such as analog filters.

PRIOR ART DISCUSSION

Such testing is typically carried out using mixed-signal Automatic Test Equipment (ATE). ATE cost is expensive as it typically requires highly computational and precision electronic components to test the ever-increasing complexity of mixed-signal logic found on integrated circuits. These ATE platforms typically consist of multi-Digital Signal Processors (DSP) and high-performance ADC/Digital to Analog Converters (DAC) devices that enable off-chip signal generation and data acquisition. DSP cores carry out testing using the ADC test methods in the IEEE standard for terminology and test methods for analog-to-digital converters—IEEE 1241-2000. ATE also requires access to the cores at the pin level and this forces developers to add external IO which drives up the packaging cost. Exhaustive testing is carried out during the prototype phase for complete device characterisation using high precision instruments and a subset of these test are carried out in production testing to lower test cost.

In recent years some approaches to reduce the production test complexity have involved embedding built-in-self-test (BIST) circuits on-chip.

The following summarises the state of the art.

ADC Static Testing

This is for measuring differential non-linearity (DNL), integral non-linearity (INL), gain, and offset parameters. Typically, a histogram technique is used, based on a statistical analysis of counting how many times a digital code output from an ADC occurs in the presence of an input sinusoid or ramp waveform. This technique typically needs large memory overheads for keeping reference data for histogram code analysis. References [1] and [2] below describe techniques This is for measuring differential non-linearity (DNL), integral non-linearity (INL), gain, and offset parameters. Typically, a histogram technique is used, based on a statistical analysis of counting how many times a digital code output from an ADC occurs in the presence of an input sinusoid or ramp waveform. This technique typically needs large memory overheads for keeping reference data for histogram code analysis. References [1] and [2] below describe techniques aimed to reduce the memory overhead, by using a linear input ramp as test signal and comparing an actual count of the outputs codes to an expected Hit per Code (HPC) count.

Ref [1]: F. Azais, S. Bernard, Y. Bertrand, and M. Renovell, "A Low-Cost BIST Architecture for Linear Histogram Testing of ADCs," J. Electron. Test., vol. 17, pp. 139-147, 2001.

Ref [2]: E. S. Erdogan and S. Ozev, "An ADC-BiST scheme using sequential code analysis," in Proceedings of the conference on Design, automation and test in Europe Nice, France: ACM Press, 2007.

The BIST design is programmable and incorporates a linear ramp as input to the ADC and a linear test engine that measures INL, DNL, gain and offset in parallel. It also tracks code counts at the code transition points within a programmable +/−N LSB range around the current code value to provide an improved technique for accurate measurement of static parameters and ADC monotonicity is also recorded.

ADC Dynamic Testing

This is used for measuring parameters such as signal-to-noise-Ratio (SNR), total harmonic distortion (THD), inter-modulation distortion (IMD), signal-to-noise-and distortion (SINAD), and spurious free dynamic range (SFDR). The Fast Fourier Transform (FFT) has become the most commonly used measurement technique with the advent of signal processing technologies such as digital signal processors (DSPs) incorporated into many mixed-signal ATE testers. The FFT is a fast way of computing the discrete finite Fourier transform of a signal which determines the amplitude of a particular frequency sine-wave or cosine wave in a signal. The algorithm multiplies the signal, point by point, with a unit amplitude sine-wave. The result is averaged over an integer number of sine-wave cycles. Fourier analysis is applied to extract ADC parameters such as SNR, THD, IMD, SINAD and SFDR by applying a sinusoidal signal as input and performing measurements based on a large number of samples to achieve the required accuracy. References [3] and [4] below describe such approaches.

Ref [3] M. G. Flores, M. Negreiros, L. Carro, A. A. Susin, F. R. Clayton, and C. Benevento, "Low Cost BIST for Static and Dynamic Testing of ADCs," Journal of Electronic Testing, vol. 21, pp. 283-290, 2005.

Ref [4] M. F. Toner and G. W. Roberts. A BIST scheme for an SNR test of a sigma-delta ADC. In International Test Conference 1993, pages 805-814, 1993.

The BIST design incorporates a dynamic test engine consisting of a programmable CPU architecture that is optimized for FFT and ADC parameter extraction providing the best balance between silicon area overheads and test time availability.

The invention is directed towards providing improved testing systems and methods.

SUMMARY OF THE INVENTION

According to the invention, there is provided a test system comprising:
  a memory for storing sample data and instructions;
  a dynamic test engine adapted to control input of dynamic test waveforms including sinusoidal waveforms to a device under test and to determine device under test dynamic parameters by analysing the samples;
  a linear test engine adapted to determine device under test static parameters, and to control input of ramp input waveforms to the device under test;
  a test controller adapted to perform finite state machine control of testing of a device under test by the linear test engine and by the dynamic test engine;
  a programmable digital to analog converter for controlled waveform generation under instructions from the linear test engine and the dynamic test engine; and
  an interface for communication with an external host.

In one embodiment, the system comprises a bus and wherein the linear test engine, the dynamic test engine, the memory, and the programmable digital to analog converter are linked with the bus, and wherein the test controller is linked with the bus and with the interface.

In one embodiment, the test system is part of a system-on-chip with the device under test.

In one embodiment, the device under test is an analog-to-digital converter.

In one embodiment, wherein the test system is adapted to re-use the memory for and at least some other system components for use other than test and measurement.

In one embodiment, the dynamic test engine comprises a central processing unit core comprising registers and units for performing arithmetic operations, sine/cosine accelerator operations, control operations; and wherein the system is adapted to allow re-use of said central processing unit core for general purpose functional application.

In one embodiment, the linear and dynamic test engines are adapted to perform parallel linear and dynamic testing in which dynamic testing sample acquisition and processing takes place during application of a ramped input for linear testing.

In one embodiment, the linear test engine is adapted to extract static parameters from a device under test over a single ramp period on-the-fly as dynamic test samples sample are being acquired.

In one embodiment, the DAC has a programmable resolution for testing an ADC device under test.

In one embodiment, the linear test engine is adapted to execute an accurate record of ADC code bin counts using code detection unit hardware to precisely measure Hits-per-Code from a linear ramp and respond with maximum and minimum INL/DNL gain and offset results.

In another embodiment, the linear test engine comprises a code detection unit adapted to record device under test code counts using control logic combined with a hits-per-code register and is additionally adapted to measure code counts to take into account code transition points.

In one embodiment, the linear test engine is adapted to record ramp histogram results and measure device under test parameters including gain and offset; and wherein a Hits-per-Code register file is used to record accurate code counts for missing and inter-transition code values within +/−N Least Significant Bits range of the current device under test (15) code value.

In one embodiment, the linear test engine is adapted to record device under test monotonicity and zero-code-counts ant to make them available to the interface.

In one embodiment, the linear test engine is adapted to measure device under test differential non-linearity, integral non-linearity, gain, and offset measurement.

In one embodiment, the test controller, the linear test engine, and the DAC are adapted to program linear ramp start/stop points for a ramp histogram for inner code set execution in a device under test to minimise test time.

In one embodiment, the dynamic test engine is adapted to instruct generation of high frequency sine waves and to perform Fast Fourier Transform (FFT) processing of the samples.

In one embodiment, the dynamic test engine has a single/dual multiplier architecture for dynamic parameter analysis.

Preferably, the dynamic test engine (4), test controller (2) and DAC (3) are coordinated together and adapted to use the COordinate Rotation DIgital Compute (CORDIC) architecture for generating sinusoidal waveforms to the DAC. In one example, the dynamic test engine CORDIC architecture reduces memory and logic overhead for generating sinusoidal waveforms on-chip by alleviating the need for dedicated Sine/Co-Sine coefficient tables and by using the linear test time characteristics to enable an optimal feature-set taking the trade-offs such as area overhead, instruction code size, memory size and test time duration into consideration.

In one embodiment, the dynamic test engine comprises a CPU which is available as a calibration unit to fix codes for parameters including gain and offset and can be reused as a functional component when not in use for test purposes In one embodiment, the system components are adapted to be re-configured for testing of a DAC device under test.

In one embodiment, the system components are individually addressable to be modular.

In one embodiment, the test controller and the test interface are adapted for multi-site device testing by interfacing with automatic test equipment.

In one embodiment, the test controller is adapted to co-ordinate said test engines and to apply test waveforms to the DAC, while dumping samples to the memory, and retrieving static and dynamic results.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

Figure 1:
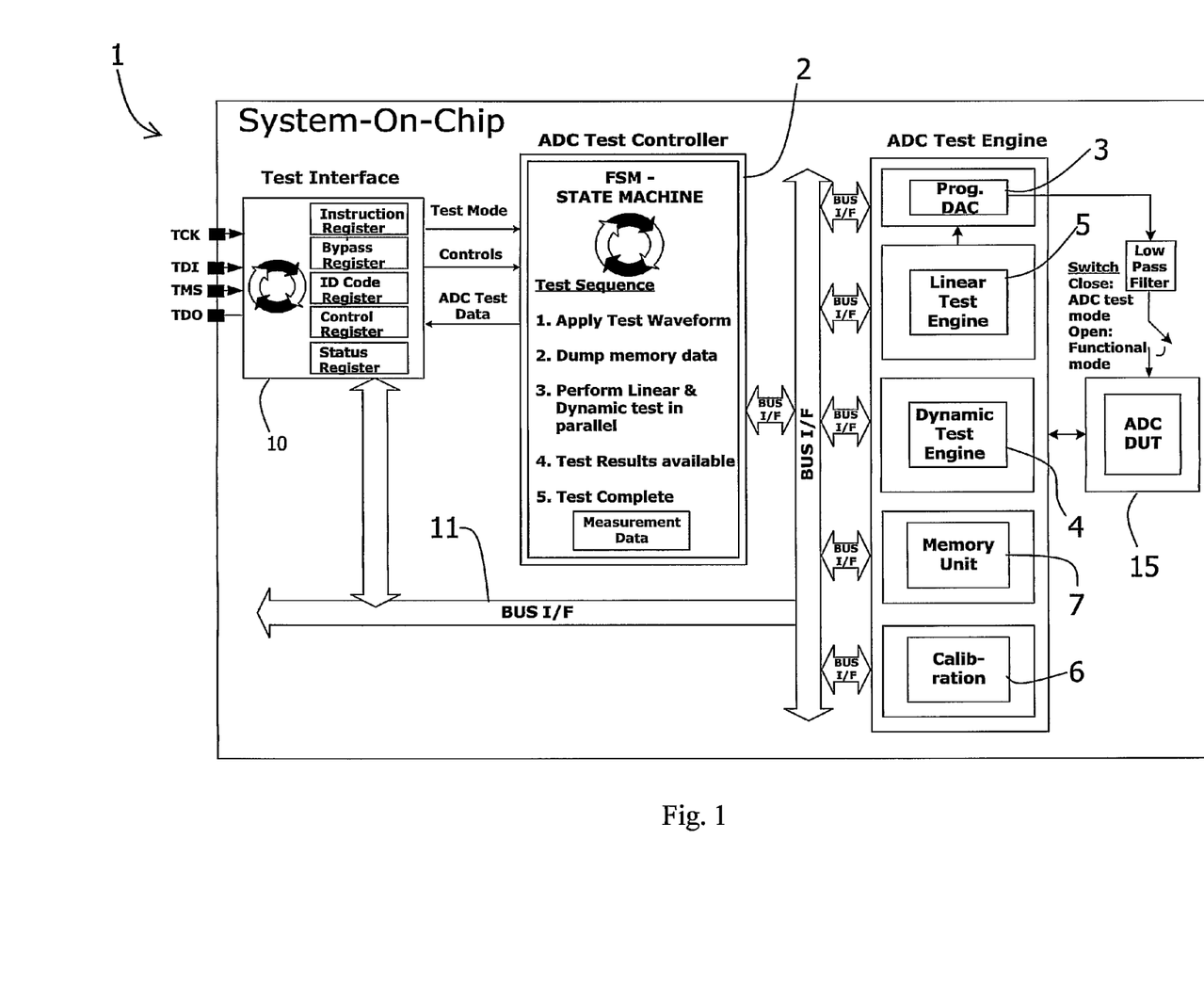
FIG. 1 is a block diagram of a system-on-chip test system of the invention incorporating an ADC under test.

FIGS. 1 to 7 illustrate the architecture of a system-on-chip ("SoC") ADC test system 1 of the invention. FIG. 1 shows the ADC test architecture main test components, which are a test controller 2, a programmable DAC 3, a dynamic test engine 4, a linear test engine 5, a calibration engine 6, and a memory unit 7. Communication between the various units is via a JTAG test interface 10 to system bus 11 and test controller 2. The test controller 2 operates as a state machine which devolves control to the peripheral blocks 3 to 7 which constitute a complete platform for on-chip ADC testing. The test controller 2 interfaces to an external test manager or host via the IEEE 1149.1 test interface 10 to initiate the test sequence. The test interface 10 is also directly connected to the bus 11. Thus, the test interface 10 can convey control instructions via the test controller 2, even to the extent of changing registers on the test controller 2, or can directly access the modules 3 to 7. This modularity allows the test controller 2 to be reused by a CPU already on-chip or any other programmable device that is available to replace the test controller for minimising area overhead. The test components 2, 3, 4, 5, 6 and 7 are separately addressable over the system bus 11 enabling a modular design approach for combined device testing 15 using all test components or separate independent testing with a subset of the test components. Functionality embedded in the ATE platform could also replace the test controller and other individual or collective BIST parts such as the memory, DAC and dynamic test engine-CPU components to sequence the ADC test events and minimize even more silicon overhead.

FIG. 1 also shows the on-chip ADC 15 under test. For clarity purposes the ADC 15 is illustrated as being much smaller than the testing system, however, with memory reuse capability in a SoC, the ADC typically occupies a greater silicon area.

In this embodiment, the full testing system is on-chip. However, it is envisaged that, due to the modular nature of the testing system, some of it may be off-chip and linked in via the test interface 10. For example, the test controller may not exist on-chip, its functionality being performed by an external controller such as a computer.

Advantages which arise from the testing system being on-chip include the fact that in-factory testing can be conveniently carried out at both the design characterisation and production testing stages. Also, it can allow testing in the field at any desired stage during use of the ADC. Also, because functionality is on-chip, testing is considerably speeded up.

Figure 2:
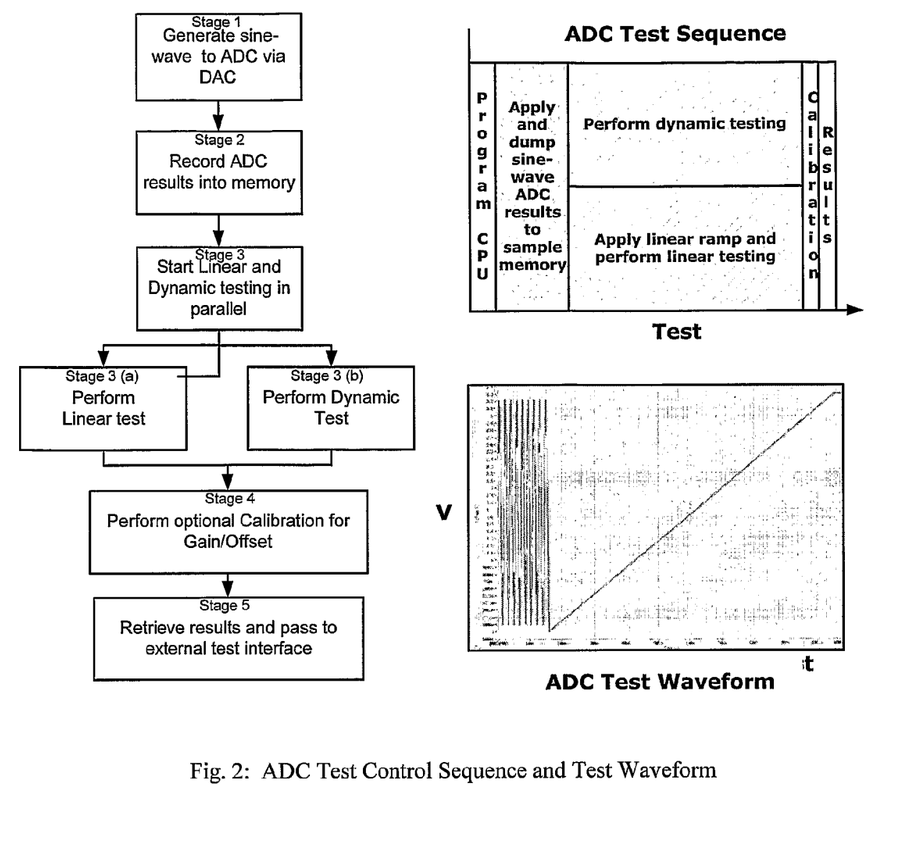
FIG. 2 shows the ADC sequence test sequence and a test waveform.

FIG. 2 is a diagram of the test controller 2 actions and sequence of events, which are:

a) Generate and apply sine wave to ADC 15 under test.
b) Record the ADC 15 results from the sine-wave into the memory unit 7.
c) Perform linear and dynamic testing to occur concurrently.
d) Initiate dynamic testing by controlling the dynamic test engine 4 to perform FFT and parameter measurement using the control signals and bus interface between the test controller 2 and dynamic test engine 4. The input waveforms for dynamic testing are shown on the left in the plot of FIG. 2—high frequency sine waves. Dynamic testing also involves acquiring resultant samples from the ADC 15 output and saving them to the memory unit 7, and performing Fast Fourier Transform (FFT) processing on these samples.
e) Initiate linear test using control signals to apply a ramp signal from the programmable DAC 3 to the ADC 15 under test and initiating the test from the bus interface 11 to the linear test engine 5. Testing occurs in the linear test engine 5 until the ramp has completed and the control signals determine the end of test, again using the bus interface. The linear ramp input is shown in FIG. 2 to the right of the dynamic testing sine waves. Parallel linear and dynamic testing is achieved because the dynamic testing FFT processing takes place during the ramped input for the linear testing. Dynamic testing and linear testing is done concurrently once the samples for FFT execution have been acquired and this saves on extra test time. Linear testing achieves time savings as all static parameters are extracted over a single ramp period on-the-fly as ADCs sample are being acquired.
f) In some embodiments, perform auto-calibration using the measured results to compensate for gain and offset adjustments.
g) Retrieve ADC test measurement results from linear and dynamic test engines 5, 4 and pass details to external tester via the test interface 10.

While in the above we have described parallel dynamic and linear testing, the system 1 has the flexibility to perform them independently, due to the modular nature of the units 3 to 7 linked with the bus 11.

Figure 3:
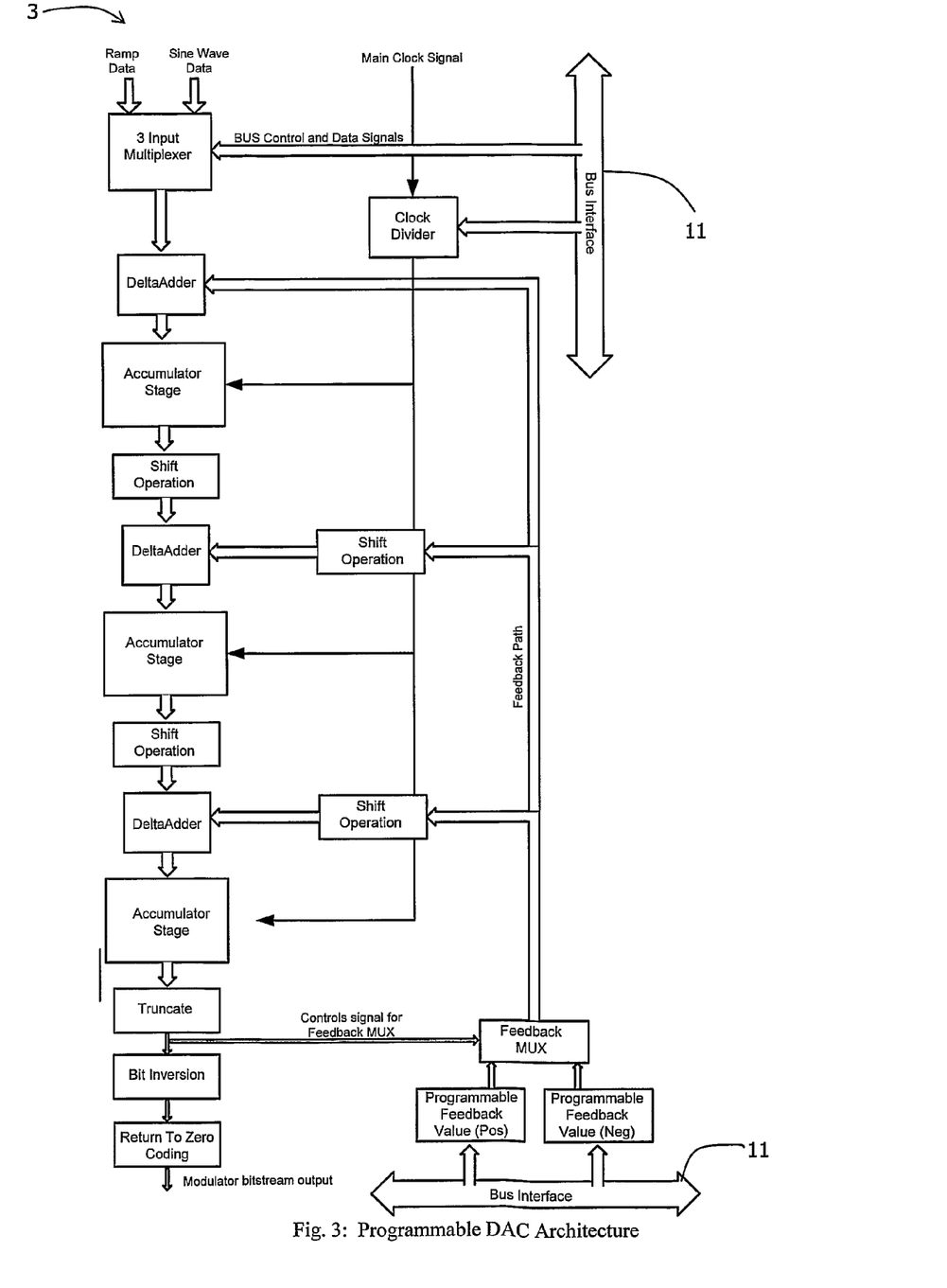
FIG. 3 illustrates a programmable DAC of the system.

The programmable DAC 3 design shown in FIG. 3 is suitable for ASIC integration and testing with the other blocks including the dynamic and linear test engines 5 and 4. Important aspect of the programmable DAC shown in FIG. 3 are that the programmable feedback circuits control resolution of the DAC waveform generator, allowing control over the signal amplitude and permitting the modulator to accept a wide range of input signals. The DAC's internal clock divider allows the modulator to operate at various frequencies. This permits the modulator to resolve input values for a defined number of cycles, resulting in greater control over the oversampling ratio and output frequency.

Another aspect of the test controller 2 and DAC 3 is that linear ramp start/stop points for the ramp histogram can be programmed for inner code set execution to lower test time even further for a reduced code test approach.

Figure 4:
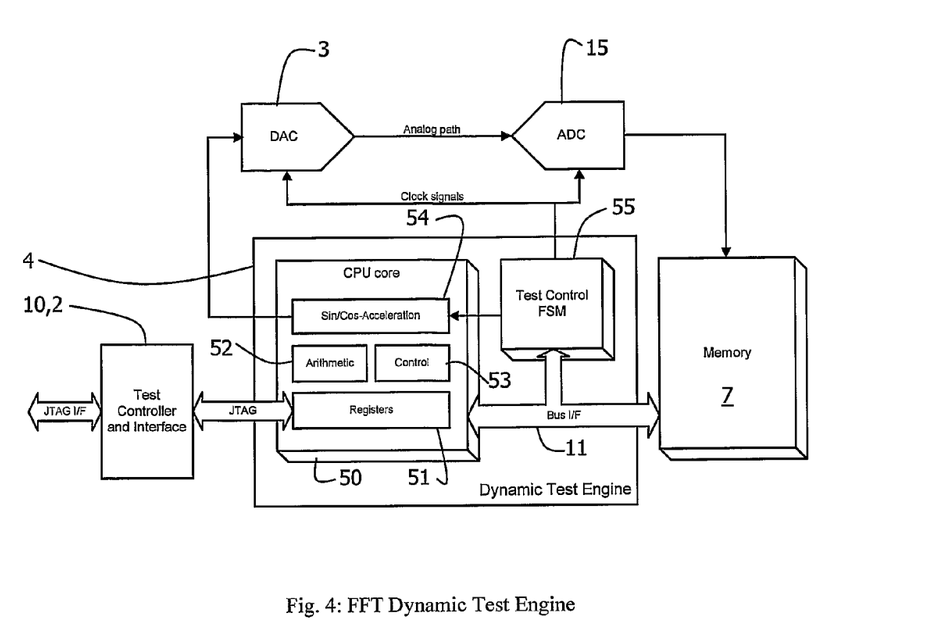
FIG. 4 is a diagram showing a dynamic test engine of the system.
Figure 5:
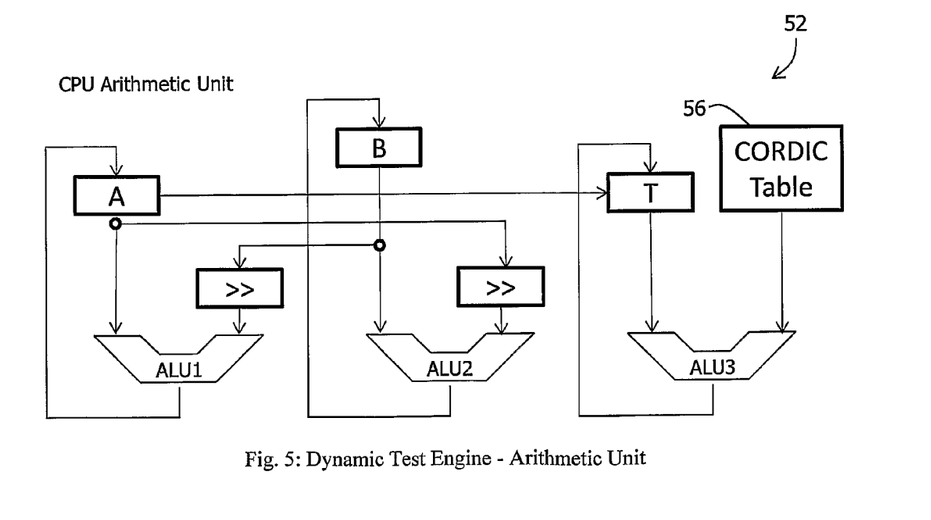
FIG. 5 shows the arithmetic architecture of the dynamic test engine.

Referring to FIGS. 4 and 5 the dynamic test engine 4 has a programmable CPU architecture specification and algorithms designed to perform FFT testing and parameter extraction. It encompasses the CORDIC and single or dual serial booth multiplier architecture. The architecture uses a CORDIC constant table of 32 words which reduces the area overhead that is required to store sine/cosine coefficients for FFT execution. This design also enables the dynamic test engine 4 to generate the sine wave frequency required for dynamic data acquisition at the start of testing. The dynamic test engine 4 is a low area CPU architecture that is designed to take into account the typically longer linearity test time. It is designed specifically taking area, computation speed, accuracy, and memory code size into account for dynamic testing in a system-on-chip BIST design. The dynamic test engine 4 CPU design is also available as a calibration unit to fix codes for gain, offset and other parameters. It can also be reused as functional component in SOC applications when not in use for test purposes.

Figure 6:
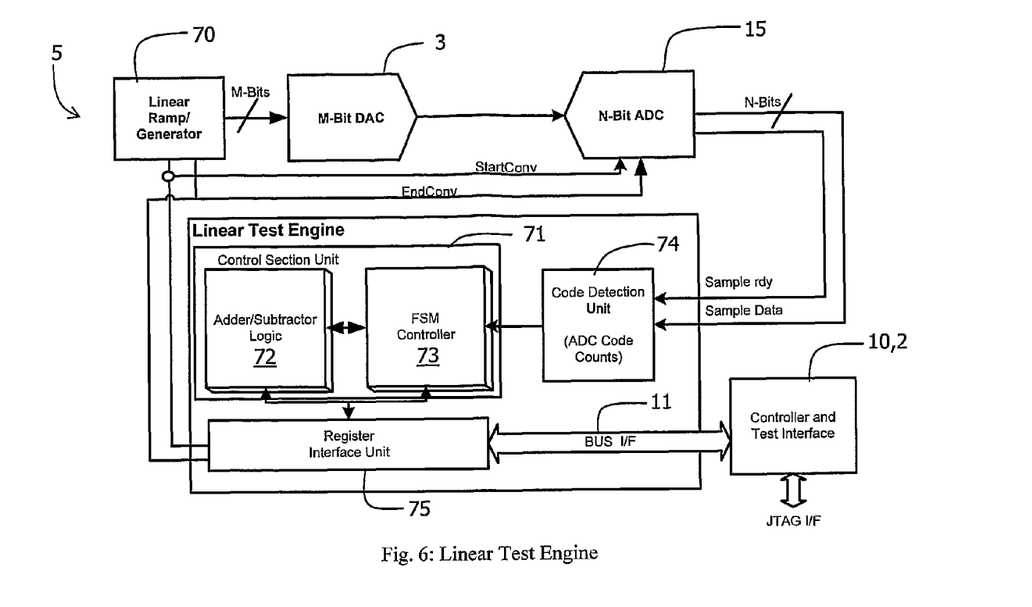
FIG. 6 shows a linearity test engine of the system.
Figure 7:
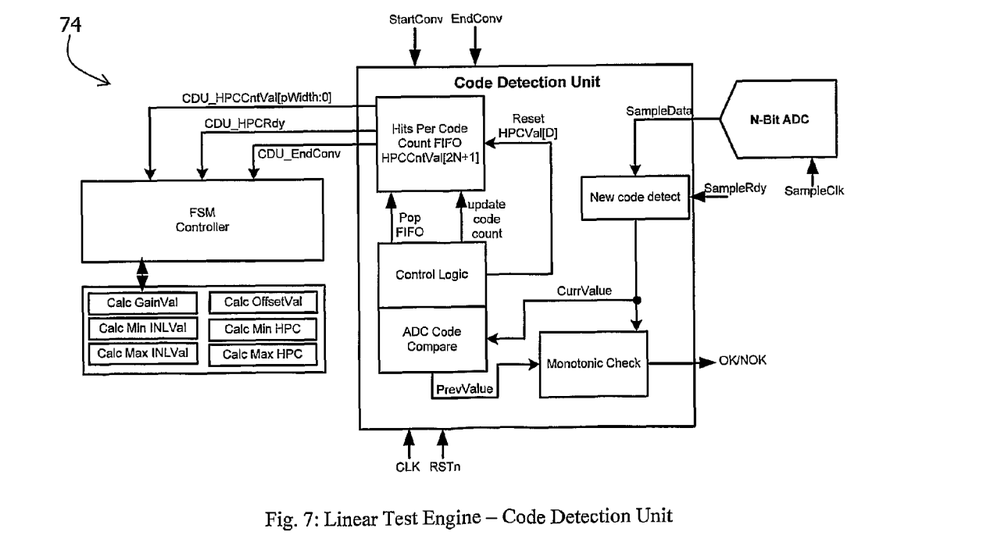
FIG. 7 shows a code detection unit of the linearity test engine.

Referring to FIGS. 6 and 7, the linear test engine code histogram testing and hardware architecture is shown. FIG. 6 shows the overall block design, whereas FIG. 7 shows the code detection unit where code counts are logged and specific counts at the code transitions points are accurately stored and passed onto the main FSM of the test controller 2.

The integration of a predominantly full digital on-chip system enables a cost-effective and non-invasive method for ADC test, debug, and calibration. No other external components are required (as would be the case for the prior art ATE) other than low-cost software on an external host computer to read out the measurement results. The system 1 can also interface to digital ATE for production testing as digital pins are only required to control the ADC test engine designs. This capability offers the advantage of cost-effective multi-part/multi-site ADC testing which is difficult to achieve on mixed-signal ATE testers where precision instruments are most costly to duplicate. As a rule of thumb, the price of a time slot for a tester that embeds high-performance analog instruments is typically twice the price of a time slot for a tester composed of digital channels and lower performance instruments.

Conventional mixed-signal ATE ADC testing uses external high precision analog and DSP instruments to perform static and dynamic tests separately in a time inefficient sequential manner. Separate waveforms for linear and dynamic testing are typically applied. ADC parameters are measured only when data is captured and sent off chip to the mixed-signal ATE tester. The system 1 enables on-chip parallel testing by using the test time available during ramp linearity test to concurrently execute dynamic FFT calculations. The time available during linear testing enables a low-area CPU architecture (dynamic test engine) that trades off time-for-area improvements to be implemented. The parallel static and dynamic test operation achieves lower test time for complete ADC test and measurement.

The programmable DAC 3 has a $3^{rd}$ order sigma-delta DAC architecture using programmable feedback coefficients for input signal scaling combined with output frequency selection capability. A digital frequency synthesizer or waveform memory data or CPU with CORDIC can be used to generate the sine-wave data into the DAC 3 for dynamic testing and a linear ramp generator into the DAC is used for static testing.

Referring to FIGS. 4 and 5, the dynamic test engine 4 consists of a CPU arithmetic architecture 52, control logic 53, sine-cosine acceleration circuits 54, and logic 55 for interfacing with the test controller 2. The arithmetic unit 52 includes a dedicated CORDIC table 56 of 32 words which enables generation of the sinusoidal waveforms on-chip to the DAC 3 combined with test controller 2. This removes the needs for storing larger area dedicated Sine/Co-Sine memory table on-chip to generate the waveforms for device dynamic testing.

The linear test engine 5 records ramp histogram results and measures ADC 15 gain, offset, DNL, and INL. All test parameters are recorded in parallel, leading to much shorter test times. A programmable Hits-per-Code (HPC) count register file or FIFO is used to record accurate code counts for missing and inter-transition code values within +/−N-Least Significant Bits (LSB) range of the current ADC code value. ADC monotonicity and zero-code-counts are recorded and made available to the test interface 10. A full linear analysis can be made available to the off-chip test manager via the test interface 10.

The programmable dynamic test engine 4 consists of a small dedicated processor CPU to measure dynamic ADC 15 parameters such as SNR, SINAD, Total Harmonic Distortion (THD), Intermodular Distortion (IMD) and Spurious Free Dynamic Range (SFDR). A single/dual serial booth multiplier architecture enables optimum Fast Fourier Transform (FFT) computation. A dedicated CORDIC unit enables faster sine/cosine computation with little or no loss in accuracy. CORDIC unit can be re-used for sine-wave generation into ADC reducing system memory requirements. There is a low silicon overhead and quick test time for dynamic parameter measurement.

The calibration engine 6 performs optional sample correction from the ADC 15 under test using the extracted parameters measured from the linear and/or dynamic test engines 5 and 4. The auto-calibration occurs on-the-fly by compensating the ADC sample codes with the measured gain, offset and other code adjustments.

The test controller 2 manages the DAC 3 for programmable on-chip waveform generation. It sequences and synchronises measurement of the target ADC 15 by controlling DAC and ADC measurement engines using coherent clock synchronization and full period sine-wave generation to avoid the need for FFT windowing operations. The dynamic and linear test engines 4 and 5 operate in parallel to minimise test time. Also, the test controller 2 performs optional ADC calibration using the linear or dynamic measurements results. It issues final ADC measurement results to the external test interface 10, and it issues full linear analysis to the external test interface by command.

The DAC 3 allows for controlled waveform generation and programmable resolution and signal sampling interval control enables increased Hits-per-Code (HPC) ADC 15 analysis. Sine-wave generation into the DAC 3 is generated by using the CORDIC protocol in the dynamic test engine 4, minimizing logic overhead.

Within the dynamic test engine 4, the low area CPU engine 50 is optimised for FFT and ADC dynamic parameter calculations. The dynamic test engine CPU core contains logic for registers 51, arithmetic unit 52, control section 53 and sine-cosine acceleration 54. The CORDIC constant table 56 combines with single or dual serial booth multiplier architecture support in the arithmetic unit 52. The dynamic test engine 4 performs the dynamic parameter execution and analysis generating results such as SFDR, SINAD, SNR, THD and IMD. The CPU engine 50 consists of logic 55 to interface with the test controller 2, 10 to sequence control and access test results. The CPU engine 50 is embedded in the system 1 (FIG. 4). The main memory of the SoC 1 is reused for the CPU operation.

FIG. 5 shows the arithmetic architecture of the CPU 50. It consists of three arithmetic logical units (ALU). ALU1 is used for general instructions (Add, Subtract, Shift, Logical Operations). ALU2 and ALU3 are able to perform add/subtract instructions for the CORDIC implementation. A small table is implemented using read-only memory and holds the coefficients needed for the CORDIC iteration process. Two barrel-shifters are used to shift the coefficients for each CORDIC iteration step. Depending on the mode of operation the registers are used for the iterative CORDIC instructions or serial multiplication. The mode of operation is changed using multiplexers. The CORDIC is able to compute sine/cosine and the absolute value of complex numbers which speeds up FFT and parameter computation and reduces memory requirements. The CORDIC unit is re-used to generate the sine-wave test signal into the programmable DAC. All CPU instructions are controlled by an overall instruction decode FSM. The test signal generation sequence is also embedded in the FSM. While the CPU engine targets ADC test execution it can be used additionally for general purpose computations by replacing the program code. To test the frequency response of other analog parts (i.e. filters) in a SoC, the CORDIC is used to generate sine-wave signals at different frequencies while the CPU records the response into memory. The analog signal path is switched using analog multiplexers.

Figures 8A, 8B:
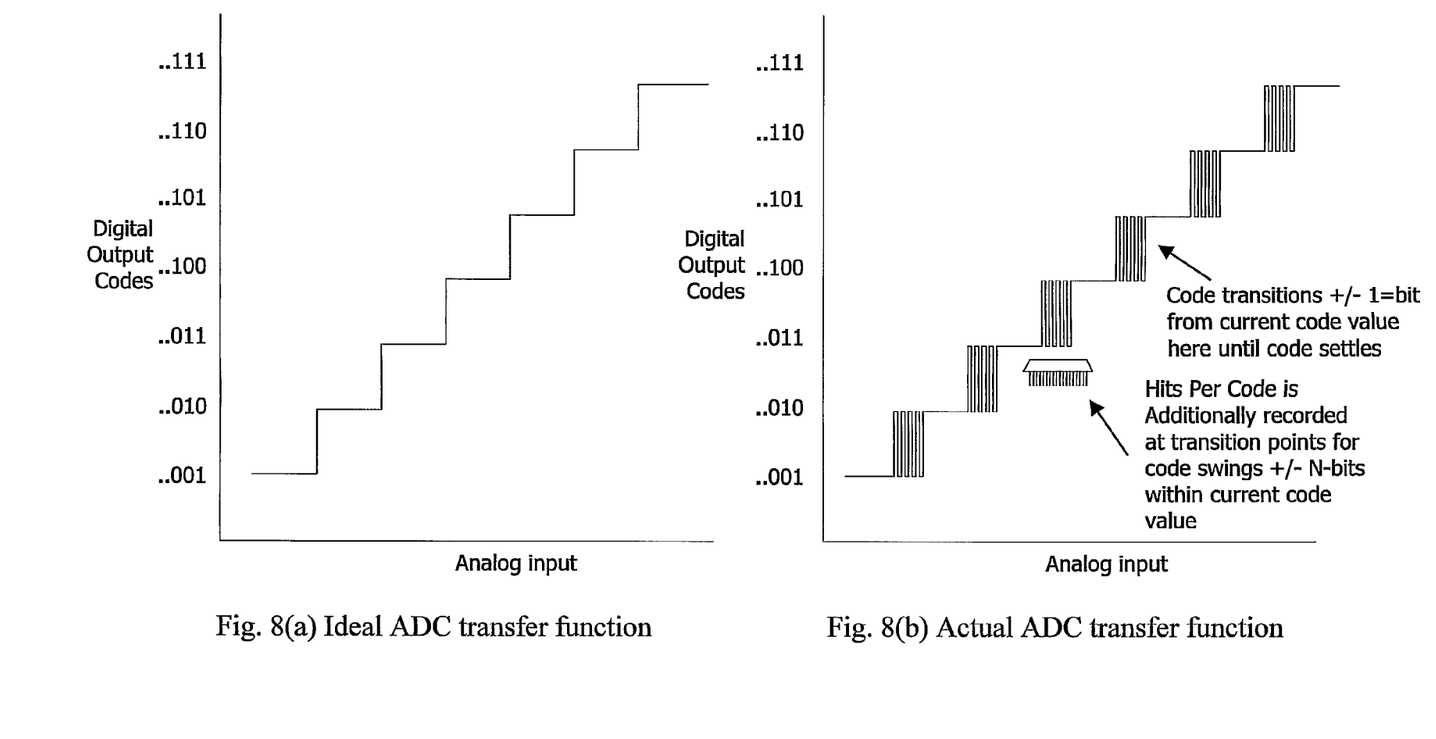
FIG. 8(a) and FIG. 8(b) illustrate the ADC transfer function with and without code transition effects.

The (low silicon area) linear test engine 5 (FIG. 6) contains adder/subtractor logic 72, finite state machine logic 73, a code detection unit 74, and register logic 75 for interfacing to the test controller 10, 2 and the ramp logic in 70. The linearity test engine can accurately determine ADC static parameters by keeping a record of ADC code counts (bins) to also include the unstable code transition points and respond with maximum and minimum INL/DNL, gain and offset results. A single increasing ramp voltage which is of sufficient resolution and is clock synchronized with the target ADC device is input to the ADC. The samples from the ADC are input to the linear test engine 5, which provides a fast and accurate histogram analysis of all code bins. A code detection unit (CDU), shown in FIG. 7, integrates a code count FIFO that keeps an accurate record of the number of Hits-Per-Code (HPC) as the input ramp traverses all of the ADC codes and features a mechanism for keeping a full count of the ADC codes at the code transition points. As each new code is detected from the ADC, a HPC count is recorded in the HPC Count FIFO. The ADC sample value swings between code values until the input ramp voltage allows the ADC to settle at a particular code value. As the analog input voltage is increased, the "ideal" ADC (shown in FIG. 8(*a*)) maintains a constant output code until a transition region is reached, at which point it instantly jumps to the next value, remaining there until the next transition region is reached. A theoretically perfect ADC has zero code-transition noise, and a transition region width equal to zero. A practical ADC has a certain amount of code transition noise, and therefore a finite transition region width. FIG. 8(*b*) shows a situation where the width of the code transition noise is less than 1 Least Significant Bit (LSB) peak-to-peak. The code detection unit allows a HPC count to be recorded for samples that are within a programmable +/−N-LSB bit range within the current code value. For example: If the code swings between the current code and the previous code value (+/−1-bit) for 5 samples each before it settles, then the HPC count is updated by +5 accordingly for each code value in the HPC FIFO.

Similarly, this approach can be utilised to count code transitions that are more than 1 LSB apart by selecting the FIFO depth to support code counts within a range +/−N-LSB bits. These accurate HPC results are used for final determination of gain, offset, DNL and INL. The code detection unit also enables zero code hit detection and determines device monotonicity. The HPC results for all code bins can also be made available to an external test manager for finer external histogram analysis.

The linear and dynamic test engines operate independently of each other to perform linear and dynamic ADC test measurements in parallel leading to lower overall test times for a complete analysis of the target ADC. The test controller synchronises and sequences these tests according to the scheme in FIG. 2. The test controller sends a command to the linear and dynamic tests engines to begin ADC testing. The parallel control is achieved by the actions of the test controller and independent IP blocks that allow the linear and dynamic test engines to operate in parallel. Once the FFT samples have been recorded into memory, the test controller initiates both ADC linear and dynamic testing to occur at the same time. The linear test engine carries out gain, offset, INL and DNL measurements at the same time while the dynamic test engine is performing SNR, SFDR and THD. The results are made available to the test controller at the end of the respective tests.

Results from the linear and dynamic test engines 5 and 4 enable automatic on-chip ADC calibration techniques to compensate for offset and gain errors found in the target ADC component. This calibration engine can remain in operation for on-the-fly ADC sample value correction in SoC functional mode once all measured tests have been carried out and parameters are available. The CPU in the dynamic test engine can be reused to perform calibration as the arithmetic architecture provides a multiplier and add/subtract capability for gain and offset adjustment on the fly. Calibration by the CPU is limited by the ADC sampling rate.

The test components used exclusively for ADC during production test can be re-used for other applications in functional mode when the ADC is not tested. This enables full use of hardware resources on-chip. Blocks such as the programmable DAC can be used as a general purpose DAC for analog signal generation on or off-chip. A switch as seen in FIG. 1 can be used to deselect the DAC in closed-loop configuration enables the DAC for other functional activity. The CPU architecture used in the dynamic test engine can also be used as a general purpose processor for other SoC activities outside of test. The program code for dynamic testing can be replaced for other functional activities at the choice of the SoC designer. Memory area assigned for FFT sample data can also be overwritten and re-used by other devices on chip that share memory resources.

Advantages of the system 1 include:
a) On-chip measurement is performed close to the target ADC device 15
b) Linear and dynamic parameter extraction occurs in parallel and facilitates lower overall test time
c) Linear and dynamic testing can operate in parallel or independently as separate test engine blocks
d) Low silicon area footprint
e) No loss of performance due to off-chip measurements
f) Less susceptible to noise and outside interference
g) This system 1 is predominantly digital, which is less complicated to integrate for test and facilitates lower test costs on a digital test platform.
h) The dynamic test engine can re-use a CORDIC block for sine-wave generation into the DAC.
i) The SoC platform components can be utilised for other functionality after test and measurement has been performed, enabling full re-use of logic resources.
   a) The programmable DAC can be re-used for other applications such as a CPU controller for audio/video applications, sensor applications and the like.
   b) The general purpose processor of the dynamic test engine 4 can be re-used as a CPU or dedicated processor for other SoC applications such as on-chip filter analysis using the CORDIC to generate sine-wave frequencies into a filter to measure the frequency response.
   c) Memory that has been used for sine-wave storage and FFT calculation can be overwritten and re-used for functional SoC applications
   d) Test controller can be merged with other test resources such as memory and digital BIST
j) Low test pin overhead—uses existing JTAG I/F found in many SoCs
k) No need for expensive ATE—Device Interface Boards (DIB) and external measurements systems or external IO which drives up packaging costs.
l) Low-cost PC can communicate with the test interface 10 to initiate test and perform results analysis
m) The system enables in-situ test debug and test diagnostics.
n) On-chip gain and offset calibration
o) ADC testing can take place independently on-chip or can be accessed from an external digital ATE tester to control the BIST operations using the on-chip test controller interface
p) The system 1 also enables multi-part/multi-site ADC device testing capability as digital ATE testers support multiple digital channels (pins) to the test controller 2 interface.

Also, the test inputs of the system 1 which consist of a combined sine wave followed by a ramp are in their nature easier to generate on-chip. The signal quality is at least 2-bits higher resolution than ADC DUT and this can be accommodated on-chip for a total inclusive BIST solution or off-chip on a test load-board to reduce logic testing on a digital ATE platform.

The system 1 only requires a memory record size for FFT calculation and CPU code execution. Typically 16K/32K-FFT record sizes are used in ADC device testing.

The invention provides practical on-chip and/or off-chip modularity of components for performing ADC test. The on-chip calibration potential enabled by the dynamic test engine 4 CPU is also advantageous. Further, ADC linearity test time is longer than dynamic test time, and the invention uses this characteristic to spread out dynamic test FFT execution over a longer duration, but not longer than what linear test times takes. This enable us to achieve a lower CPU area overhead than a general purpose DSP processor in an SoC device.

This dynamic test engine (DTE) 4 can also be reused in a customer SOC for other application reuse such as a CPU controller for audio/video applications, sensor applications and the like. A general purpose DSP/CPU could also be used instead of the DTE, if already available in an on-chip application. The same approach can also apply to the test controller, memory and the DAC components.

The system is versatile and can also used as a test system for SoC DAC devices, provided the ADC is of higher resolution than the device under test.

The system uses the JTAG 1149.1 bus as an on/off-chip interface, however the interface can also be supported by other serial digital bus standards such as SPI, or I2C and is not limited by the use or choice of off-chip interface.

The invention is not limited to the embodiments described but may be varied in construction and detail. For example, the system components 2, 3, 4, 5, 6, 7, 11 may be all contained on-chip without the interface 10 logic to access automatic test equipment and where device test pass/fail status registers are self-contained within test controller 10, to enable a complete integrated on-chip self-testing solution for in-situ/in-field device test and debug capability.

The invention claimed is:

1. A test system comprising:
a memory for storing sample data and instructions;
a dynamic test engine adapted to control input of dynamic test waveforms including sinusoidal waveforms to a device under test and to determine device under test dynamic parameters by analysing the samples;
a linear test engine adapted to determine device under test static parameters, and to control input of ramp input waveforms to the device under test;
a test controller adapted to perform finite state machine control of testing of an ADC device under test by the linear test engine and by the dynamic test engine,
a programmable digital to analog converter for controlled waveform generation under instructions from the linear test engine and the dynamic test engine; and
an interface for communication with an external host,
wherein the linear and dynamic test engines are adapted to perform parallel linear and dynamic testing in which dynamic testing sample processing takes place during application of a ramped input for linear testing,
wherein the linear test engine is adapted to extract static parameters from a device under test over a single ramp period on-the-fly as dynamic test samples are being processed,
wherein the linear test engine is adapted to determine ADC static parameters by keeping a record of ADC code counts including unstable code transition points using a single increasing ramp voltage which is clock synchronized with an ADC under test.

2. The test system as claimed in claim 1, comprising a bus and wherein the linear test engine, the dynamic test engine, the memory, and the programmable digital to analog converter are linked with the bus, and wherein the test controller is linked with the bus and with the interface.

3. The test system as claimed in claim 1, wherein the test system is part of a system-on-chip with the device under test.

4. The test system as claimed in claim 1, wherein the test system is part of a system-on-chip with the device under test; and wherein the device under test is an analog-to-digital converter.

5. The test system as claimed in claim 1, wherein the test system is part of a system-on-chip with the device under test; and wherein the device under test is an analog-to-digital converter; and wherein the test system is adapted to re-use the memory for at least some other system components for use other than test and measurement.

6. The test system as claimed in claim 1, wherein the test system is part of a system-on-chip with the device under test; and wherein the device under test is an analog-to-digital converter; and wherein the test system is adapted to re-use the memory for at least some other system components for use other than test and measurement; wherein the dynamic test engine (4) comprises a central processing unit core comprising registers and units for performing arithmetic operations, sine/cosine accelerator operations, control operations; and wherein the system is adapted to allow re-use of said central processing unit core for general purpose functional application.

7. The test system as claimed in claim 1, wherein the DAC (3) has a programmable resolution for testing an ADC device under test (15).

8. The test system as claimed in claim 1, wherein the DAC has a programmable resolution for testing an ADC device under test; and wherein the linear test engine is adapted to execute an accurate record of ADC code bin counts using code detection unit hardware to precisely measure hits-per-code from a linear ramp and respond with maximum and minimum INL/DNL gain and offset results.

9. The test system as claimed in claim 1, wherein the linear test engine comprises a code detection unit adapted to record device under test code counts using control logic combined with a hits-per-code register and is additionally adapted to measure code counts to take into account code transition points.

10. The test system as claimed in claim 1, wherein the linear test engine comprises a code detection unit adapted to record device under test code counts using control logic combined with a hits-per-code register and is additionally adapted to measure code counts to take into account code transition points; and wherein the linear test engine is adapted to record ramp histogram results and measure device under test parameters including gain and offset; and wherein a hits-per-code register file is used to record accurate code counts for missing and inter-transition code values within +/−N Least Significant Bits range of the current device under test code value.

11. The test system as claimed in claim 1, wherein the linear test engine comprises a code detection unit adapted to record device under test code counts using control logic combined with a hits-per-code register and is additionally adapted to measure code counts to take into account code transition points; and wherein the linear test engine is adapted to record ramp histogram results and measure device under test parameters including gain and offset; and wherein a hits-per-code register file is used to record accurate code counts for missing and inter-transition code values within +/−N Least Significant Bits range of the current device under test code value; and wherein the linear test engine is adapted to record device under test monotonicity and zero-code-counts and to make them available to the interface.

12. The test system as claimed in claim 1, wherein the linear test engine is adapted to measure device under test differential non-linearity, integral non-linearity, gain, and offset measurement.

13. The test system as claimed in claim 1, wherein the test controller, the linear test engine, and the DAC are adapted to program linear ramp start/stop points for a ramp histogram for inner code set execution in a device under test to minimise test time.

14. The test system as claimed in claim 1, wherein the dynamic test engine is adapted to instruct generation of high frequency sine waves and to perform Fast Fourier Transform (FFT) processing of the samples.

15. The test system as claimed in claim 1, wherein the dynamic test engine has a single/dual multiplier architecture for dynamic parameter analysis.

16. The test system as claimed in claim 1, wherein the dynamic test engine, test controller and DAC are coordinated together and adapted to use the COordinate Rotation DIgital Compute (CORDIC) architecture for generating sinusoidal waveforms to the DAC.

17. The test system as claimed in claim 1, wherein the dynamic test engine comprises a CPU which is available as a calibration unit to fix codes for parameters including gain and offset and can be reused as a functional component when not in use for test purposes.

18. A The test system as claimed in claim 1, where the system components are adapted to be re-configured for testing of a DAC device under test.

19. The test system as claimed in claim 1, where the system components are individually addressable to be modular.

20. The test system as claimed in claim 1, where the test controller and the test interface are adapted for multi-site device testing by interfacing with automatic test equipment.

21. The test system as claimed in claim 1, wherein the test controller is adapted to co-ordinate said test engines and to apply test waveforms to the DAC, while dumping samples to the memory, and retrieving static and dynamic results.

* * * * *